(12) United States Patent
Oehler et al.

(10) Patent No.: US 6,518,900 B1
(45) Date of Patent: Feb. 11, 2003

(54) CIRCUIT CONFIGURATION FOR TESTING AND A/D CONVERTER FOR APPLICATIONS THAT ARE CRITICAL IN TERMS OF SAFETY

(75) Inventors: Peter Oehler, Frankfurt-Höchst (DE); Wolfgang Fey, Niedernhausen (DE)

(73) Assignee: Continental Teves AG & Co., oHG, Frankfurt (DE)

( * ) Notice: Subject to any disclaimer, the term of this patent is extended or adjusted under 35 U.S.C. 154(b) by 0 days.

(21) Appl. No.: 09/857,282
(22) PCT Filed: Nov. 29, 1999
(86) PCT No.: PCT/EP99/09249
§ 371 (c)(1), (2), (4) Date: Sep. 6, 2001
(87) PCT Pub. No.: WO00/33465
PCT Pub. Date: Jun. 8, 2000

(30) Foreign Application Priority Data

Dec. 3, 1998 (DE) .......................... 198 55 743
Mar. 22, 1999 (DE) .......................... 199 12 766

(51) Int. Cl.⁷ .............................................. H03M 1/10
(52) U.S. Cl. ...................... 341/120; 341/118; 341/155; 341/169
(58) Field of Search ............................ 341/118, 120, 341/155, 169

(56) References Cited

U.S. PATENT DOCUMENTS

| | | | |
|---|---|---|---|
| 3,816,813 A | * 6/1974 | Jehu | 324/73 R |
| 4,352,160 A | * 9/1982 | Frech et al. | 364/553 |
| 4,539,683 A | * 9/1985 | Hahn et al. | 341/120 |
| 5,132,685 A | * 7/1992 | DeWitt et al. | 324/73.1 |
| 5,659,312 A | * 8/1997 | Sunter et al. | 341/120 |
| 5,854,598 A | * 12/1998 | De Vries et al. | 341/120 |
| 5,870,042 A | * 2/1999 | Noda | 341/118 |
| 6,333,706 B1 | * 12/2001 | Cummings et al. | 341/120 |

FOREIGN PATENT DOCUMENTS

| | | |
|---|---|---|
| DE | 40 14 863 | 12/1990 |
| DE | 43 11 858 | 5/1996 |
| DE | 694 01 476 | 1/1997 |
| DE | 690 29 958 | 2/1997 |
| DE | 690 30 814 | 5/1997 |
| DE | 196 53 592 | 6/1997 |
| DE | 691 28 509 | 12/1997 |
| DE | 197 23 641 | 2/1998 |
| DE | 196 34 049 | 3/1998 |
| WO | 97 49188 | 12/1997 |

OTHER PUBLICATIONS

"An on chip ADC test structure"; Yun–Che Wen; Kuen–Jong Lee; Design, Automation and Test in Europe Conference and Exhibition 2000. Proceedings, 2000; pp. 221–225.*

Henkel, W.; "Bestimmung der Linearität von A/D–Umsetzern"; Elektronik; vol. 15 (1984) p. 85–86.

* cited by examiner

Primary Examiner—Michael Tokar
Assistant Examiner—Khai M. Nguyen
(74) Attorney, Agent, or Firm—Rader, Fishman & Grauer PLLC

(57) ABSTRACT

The present invention relates to a circuit configuration with an A/D converter, especially for applications that are critical in terms of safety, which is especially characterized by a ramp signal generator for generating a ramp voltage that is delivered to the input of the A/D converter, and a test circuit for activating a test cycle which comprises a first run of the ramp, by which a reference measurement of the ramp signal generator is carried out for compensating component tolerances, and comprises a second run of the ramp where an error signal is output when the value that is calculated for a transmission characteristic of the A/D converter lies outside a predetermined tolerance range of the measured value of the transmission characteristic.

6 Claims, 5 Drawing Sheets

CIRCUIT CONFIGURATION FOR TESTING AND A/D CONVERTER FOR APPLICATIONS THAT ARE CRITICAL IN TERMS OF SAFETY

TECHNICAL FIELD

The present invention generally relates to test circuits and more particularly relates to a circuit configuration for testing an A/D converter, especially for applications that are critical in terms of safety.

BACKGROUND OF THE INVENTION

Reliability and failsafe operation are of special importance in circuits for safety-critical applications and systems. It is especially significant to safeguard that in case of malfunction of one component the entire system will not be jeopardized. To reach this objective it is necessary to detect faults in the component concerned and to take appropriate measures.

One such component which must oftentimes be monitored in terms of failsafe operation is e.g. an A/D (analog/digital) converter. It is known in the art to operate two identical A/D converters in parallel, to monitor the output signals of both converters for equality, and to produce an error message when equality—in consideration of usual converter tolerances—no longer exists. However, as an A/D converter is relatively costly to purchase, in particular when high demands are placed on its speed and accuracy, this solution is generally considered disadvantageous for cost reasons.

Therefore, an object of the present invention is to provide a circuit configuration with an A/D converter wherein monitoring of the function of the A/D converter, which is necessary for safety-critical applications, is possible with a reduced effort and structure in circuitry.

This object is achieved by the present invention wherein a ramp signal generator for generating a ramp voltage that is delivered to the input of the A/D converter, and a test circuit for activating a test cycle which comprises a first run of the ramp, by which a reference measurement of the ramp signal generator is carried out for compensating component tolerances, and a second run of the ramp where an error message is output when the value that is calculated for a transmission characteristic of the A/D converter lies outside a predetermined tolerance range of the measured value of the transmission characteristic.

A special advantage of this solution is that due to the reference measurement in the first run and the thus possible compensation of various tolerances of the ramp signal generator the circuit complexity of the latter can be kept within relatively close limits.

DETAILED DESCRIPTION OF THE PREFERRED EMBODIMENTS

The essence of the solution of the present invention involves constantly monitoring an A/D converter in the current normal operation with respect to its operability. Up to four criteria are applied for this purpose. On the one hand, these are directed to maintaining the tolerances of the static accuracy. Among these tolerances are offset errors, amplification faults, integral and differential linearity faults, as well as quantization faults, and noise. These quantities are comprised in the so-called total conversion accuracy.

A second criterion is directed to performing a test regarding clock failure. The third criterion refers to the time behavior of the A/D converter, namely with respect to the position of the sampling rate within an allowable tolerance range, and with respect to a correct determination of the sampling values in normal operation.

The fourth criterion serves for monitoring the reference voltage of the A/D converter.

Figure 1:
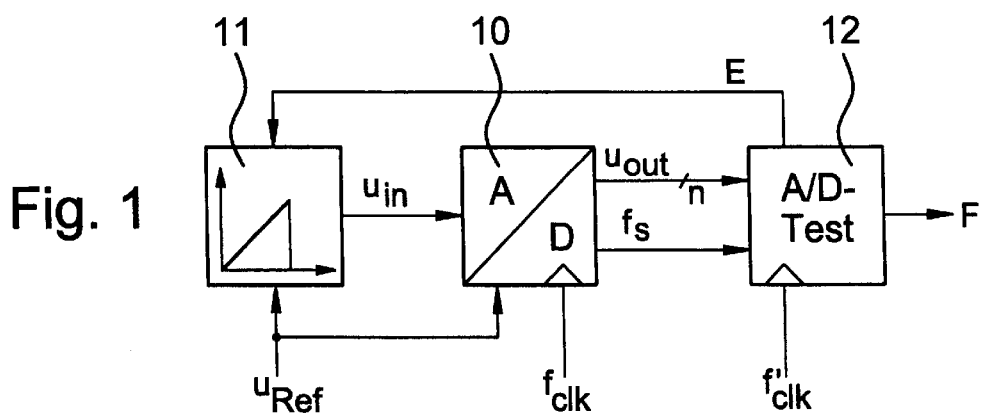
FIG. 1 is a schematic diagram of a circuit configuration with an A/D converter according to the present invention.

FIG. 1 shows a circuit diagram of a corresponding circuit configuration of the present invention. A ramp signal generator 11 is connected to the input of an A/D converter 10 being monitored. A test circuit 12 is connected to the output of the A/D converter 10. The A/D converter 10 converts the analog ramp voltage $u_{in}$ applied to its input and illustrated in FIG. 2 into a digital output voltage $u_{out}$ which is evaluated by means of the test circuit 12. The test circuit is triggered by the sampling signal $f_s$ of the A/D converter and generates a discharge signal E for the respective capacitor of the ramp signal generator.

Figure 2:
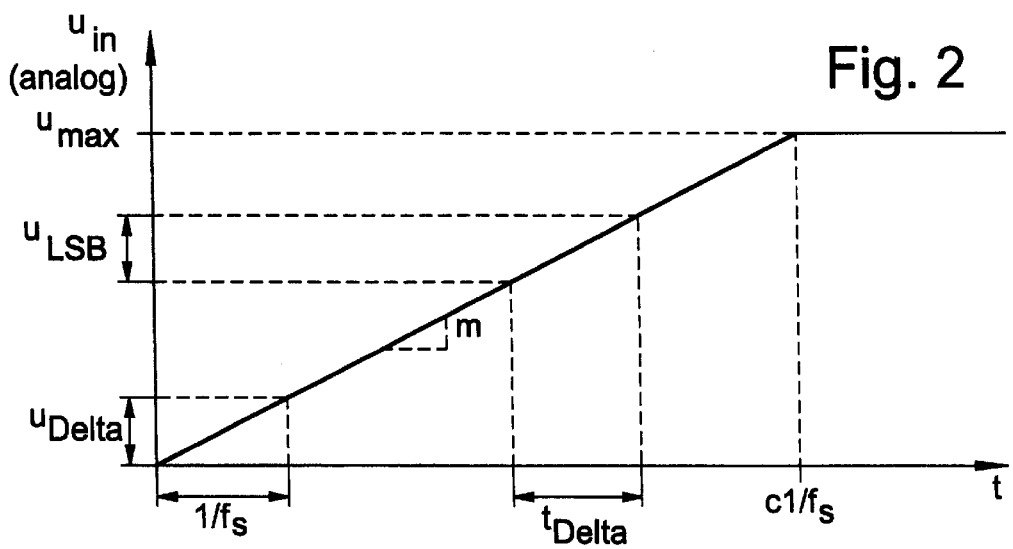
FIG. 2 is a ramp signal for actuating an A/D converter.

The gradient m of the ramp voltage shown in FIG. 2 is achieved from a current I of the reference current source and the capacitance C of the capacitor and results in m=I/C (both current source and capacitor are located within ramp signal generator 11). The result of the tolerances of the structural elements is a minimum ramp gradient $m_{min}=I_{min}/C_{max}$ and a maximum ramp gradient $m_{max}=I_{max}/C_{min}$. $m=(u_{max}*f_s)/c1$ applies in addition, with $u_{max}$ being the maximum ramp voltage and c1 being the count of the counter when $u_{max}$ is reached. Further, $m=(u_{Delta}*f_s)/1=U_{LSB}/t_{Delta}$ applies, $u_{Delta}$ being the voltage variation per sampling operation and $t_{Delta}$ being the time which is required for changing the voltage by 1 LSB. These correlations are also plotted in FIG. 2, however, the representation is not in correct scale.

The basic principle of the solution according to the present invention includes running the ramp voltage $u_{in}$ at the input of the A/D converter 10 twice and carrying out various measurements with respect to the output signals $u_{out}$. In the first run, the time period is measured which the ramp signal generator 11 requires to increase the ramp voltage from a negative reference voltage $-U_{ref}$ or the value zero (ground) to the ramp stop, that means, maximally up to the positive reference voltage $+U_{ref}$ or $u_{max}$, respectively. This period of time is recorded as a multiple of the sampling time of the A/D converter.

This measurement is used to eliminate various tolerances of the ramp signal generator 11 from the results of the second run.

In detail, these are tolerances of the reference voltage $U_{Ref}$ of the A/D converter, of the final value $u_{max}$ of the ramp (inasfar as $u_{max}<>U_{Ref}$), and a change in the ramp gradient which is caused by the tolerances of the current I of the reference current source and the capacitance C of the capacitor. Moreover, the complexity of circuitry for the ramp generator can be kept within acceptable limits due to the compensation of these tolerances.

It is now checked in a second run whether different transmission characteristics of the A/D converter lie in the specified tolerance range. Three different methods are described for this run, one or more of which can be carried out in dependence on the desired accuracy and reliability.

Figure 3:
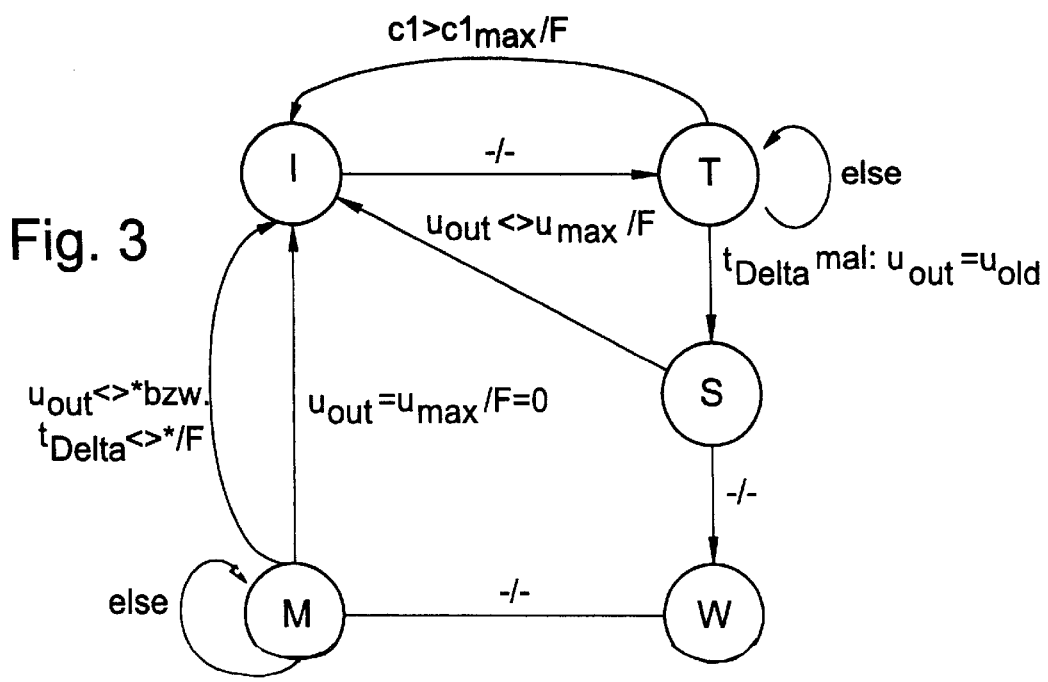
FIG. 3 is a condition transition diagram to illustrate the operation of an A/D converter according to the present invention.

These two runs are illustrated by the basic structure of a condition transition diagram of the test circuit 12 as shown in FIG. 3.

The first run starts with an initialization (I) by which the capacitor of the ramp signal generator is discharged by the discharge signal E (FIG. 1) and a first counter is reset. While subsequently the ramp voltage rises, a first counter counts the sampling signals. In case no ramp stop is detected after a defined period of time (reaching of a maximum count $c1_{max}$), an error signal F is produced. When a ramp stop is detected, the test circuit passes over into the setup condition (S). At the end of this first run, it is still checked whether the maximum ramp voltage $u_{max}$ reached lies within a specified tolerance range ('full scale error'). If this is not the case, the error signal F will be produced).

In the absence of any of the mentioned error signals f, depending on the method chosen, $u_{Delta}$ or $t_{Delta}$ is calculated and the capacitor of the ramp signal generator is discharged again and, if the A/D converter has a calculation time (latent period) of a sampling time, a waiting condition (W) is set.

In the second run (M) which will follow now, one or more of the above-mentioned three methods will be performed selectively; voltages are tested with the first and second method at defined points of time, while periods of times are sensed at defined voltage variations by means of the third method. When these voltages or times lie outside the tolerance ranges, the error signal is generated. Otherwise, the measurement is terminated as fault free when the ramp stop is sensed, and the next measurement is initialized (I).

Figure 4:
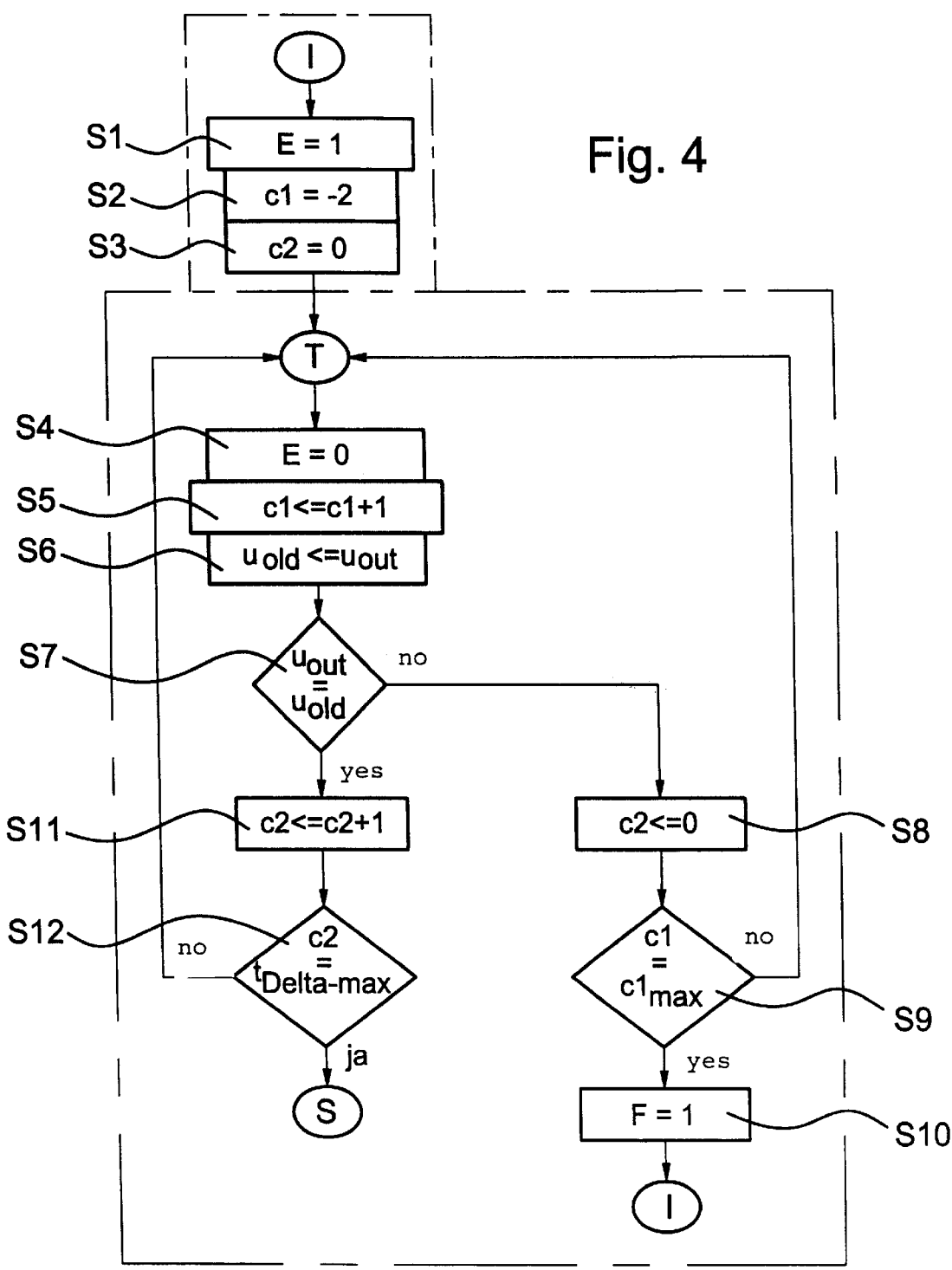
FIG. 4 is a flow chart of a first part of a first, second, and third method of the present invention.

FIG. 4 shows the flow chart of the run of the conditions I (initialization) and T (time measurement) which are carried out with the test circuit and which are equal for all three methods.

The initialization I starts in a step S1 with the generation of the discharge signal E for the capacitor C of the ramp signal generator. Subsequently, the count c1 of a first counter is reset in a step S2, namely to a value of −2, with the result that delays caused by the algorithm and the calculation time of the A/D converter (latent period) are compensated. Besides, the count c2 of a second counter is set to zero with a step S3.

The subsequent time measurement (T) takes place in two loops and commences with setting the discharge signal E to zero in a step S4. In addition, according to step S5, the count c1 of the first counter, by which the number of sampling operations until reaching of the ramp stop is counted, is increased by the value 1 and, according to step S6, the output voltage $u_{out}$ of the A/D converter is stored as a value $u_{old}$. Following step S6, a new sampling signal is waited for to occur so that a new modified value of $U_{out}$ will prevail (see on the bottom of page 5). Thereafter, a polling is made in a step S7 whether the new value $u_{out}$ of the output voltage equals the old value $u_{old}$. When this polling can be answered with 'no', the count c2 of the second counter is set to zero according to step S8, and a polling is made in step S9 as to whether the count c1 of the first counter has reached its maximum value $c1_{max}$. When this is not the case, this run is repeated commencing step S4 because the output voltage $u_{out}$ changes with every sampling operation, on the one hand, and the number of sampling operations $c1_{max}$ necessary for reaching the ramp stop has not yet been reached, on the other hand.

If, however, the polling according to step S9 is answered by 'yes', that means, when the maximum number $c1_{max}$ of sampling operations is reached, even the one necessary for the most unfavorable case, where the ramp stop is assumed to have been reached in a guaranteed way when the A/D converter is operating properly, an error message will be produced due to non-reaching of the ramp stop in a step S10, and the run will be repeated starting with the initialization (I).

As soon as the output voltage $u_{out}$ of the A/D converter will change no more compared to the previous sampling operation and, thus, the polling is to be answered with 'yes' in step S7, the count c2 of the second counter is increased by the value 1 in step S11, and a polling is made in step S12 whether this new count is equal to the value of $t_{Delta-max}$, that means, the number of sampling operations at which the output voltage $u_{out}$, in the most unfavorable case, rises by 1 LSB during the rise of the ramp voltage. When this polling is answered with 'no', the time measurement T is repeated and the run is continued with step S4. If, on the other hand, the polling is answered with 'yes', that means, the ramp stop was reached, the automatic test machine will pass over into the condition S ('setup').

Figure 5:
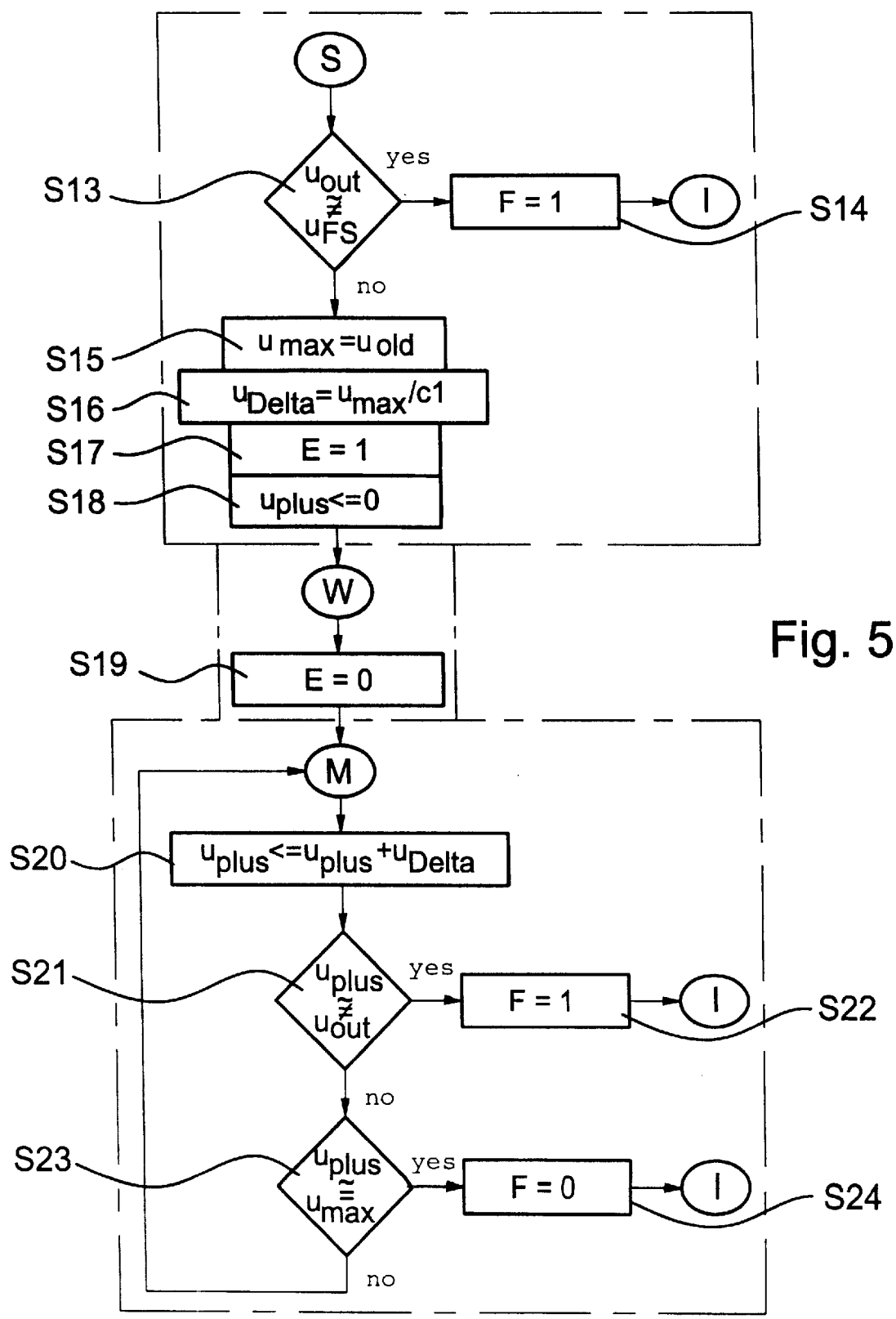
FIG. 5 is a flow chart of a second part of the first method of the present invention.

FIG. 5 now shows the second part (conditions S, W, and M according to FIG. 3) of the further procedure for the first method. The setup condition S starts with the polling in step S13, as to whether the measured ramp stop voltage $u_{out}$ lies outside the tolerance range $u_{FS}$, wherein $u_{FS}$ is the output value of the A/D converter at the end of the range ('full scale'). When this is the case, an error signal F is set to the value 1 in step S14, and the run is repeated with the initialization I according to FIG. 4.

When the polling is answered with 'no' in step S13, the value of the maximum output voltage $u_{max}$ is set to the last value $u_{old}$ of this voltage in step S15, and the average voltage variation $u_{Delta}$ per sampling operation is calculated ($u_{Delta}=u_{max}/c1$) in step 16. Thereafter, the capacitor of the ramp signal generator is discharged by producing the discharge signal E=1 in step S17, and a comparison voltage $u_{plus}$ which as a calculated voltage is to be compared with the voltage to be measured is set to zero with step S18.

The automatic test machine will then assume the waiting condition W and set the discharge signal E to zero in step S19 for the capacitor of the ramp signal generator.

Then, the actual voltage measurements will be carried out in the measuring condition M. For this purpose, initially the comparison voltage $u_{plus}$ is incremented by the value $u_{Delta}$ in step S20. In step S21, a polling is then made as to whether the output voltage $u_{out}$ lies outside the tolerance range of the comparison voltage $u_{plus}$. When this is the case, an error signal F is set to the value 1 with step S22, and the run is repeated with the initialization I according to FIG. 4.

When this polling is answered with 'no' in step S21, a polling is made in step S23 as to whether the comparison voltage $u_{plus}$ lies within the tolerance range of the maximum output voltage $u_{max}$. When this polling is answered with 'yes', the error signal F is set to the value 0 according to step S24. The ramp stop is reached in this case $u_{plus}$, and the measurement is completed as failfree because, according to step S21, the measured output voltage $u_{out}$ does not lie outside the tolerance range of the calculated comparison voltage $u_{plus}$. The entire run may then be repeated with the initialization I according to FIG. 4.

When the polling in step S23 is answered with 'no', the ramp stop is not yet reached, and the voltage measurement is repeated by return of the run to the start of the condition M.

All inaccuracies of the A/D converter must be taken into account appropriately in the two tolerance ranges.

Figure 6:
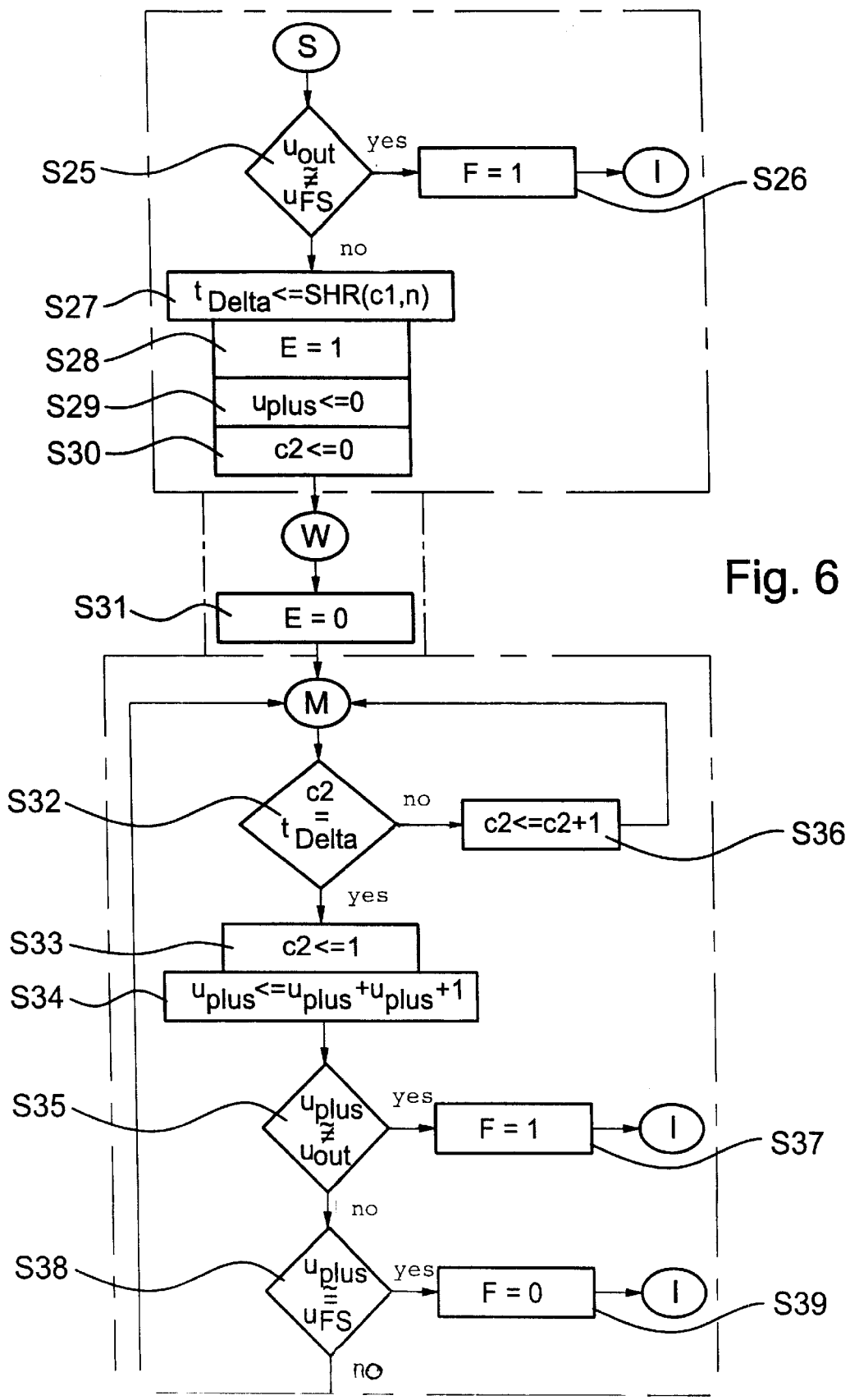
FIG. 6 is a flow chart of a second part of the second method of the present invention.

FIG. 6 shows the second part of the run (conditions S, W and M) for the above-mentioned second method. The main difference is that in contrast to the first method, instead of $u_{Delta}$, now $t_{Delta}$ (=$1/u_{Delta}$), that means, the time which is required for the variation of the voltage by 1 LSB, is calculated in the setup condition S.

This calculation is done by a division or a slide operation by n bit to the right, if the reference voltage $U_{Ref}$ of the A/D converter is used as a maximum ramp voltage $u_{max}$ (in this case there is no need for measuring $u_{max}$ because this value is already known except for the tolerance range [full scale error]).

It is tested for all values $t_{Delta}$ during the measurement (condition M) whether the output voltage $u_{out}$ measured at the A/D converter lies in the allowable tolerance range, and the output voltage is compared to a nominal value $u_{plus}$ which is incremented by 1 LSB (or a multiple thereof) for all $t_{Delta}$. Alternatively, this comparison may also be carried out with each sampling operation.

Specifically, the run in the condition S starts with a polling operation in step S25 as to whether the output voltage of the A/D converter lies outside the tolerance range $u_{FS}$. When this is the case, the error signal F is set to the value 1 with step S26, and the run is continued by returning to the initialization I. When the polling is answered with 'no', the value $t_{Delta}$ is calculated in step S27 as indicated hereinabove. Subsequently, the discharge signal E for the capacitor of the ramp signal generator is set to the value 1 in step S28, the value of the comparison voltage $U_{plus}$ determined by calculation is set to the value 0 in step S29, and the count c2 of the second counter is also set to the value 0 in step S30.

During the following waiting condition W, the discharge signal E for the capacitor of the ramp signal generator is set to the value 0 in step S31.

The actual voltage measurement is now carried out in the measuring condition M. For this purpose, a polling is initially made in step S32 as to whether the count c2 of the second counter corresponds to the time period $t_{Delta}$. When this is not the case, the count c2 is incremented by 1 with the loop formed by step S36 until the polling is answered with 'yes' in step S32. If so, the count of the counter is set to the value 1 in step S33, and the comparison voltage $u_{plus}$ is incremented by the value 1 in step S34.

Following in step S35 is a polling operation whether the output voltage $u_{out}$ lies outside the tolerance range of the comparison voltage $u_{plus}$. In the positive, the error signal F is set to the value 1 in step S37, and the run is repeated by return to the initialization I (FIG. 4).

When the output voltage $u_{out}$ does not lie outside the tolerance range of the comparison voltage $u_{plus}$, a polling is made in step S38 whether the comparison voltage $u_{plus}$ lies within the tolerance range of the ramp stop voltage $u_{FS}$. When this polling is answered with 'yes', the error signal F is set to the value 0 in step S39, and the run is continued by return to the initialization I. Otherwise, there is a reset to the start of the measuring condition M.

In the first and second method, the summing Of $u_{Delta}$ and, respectively, the counting of $t_{Delta}$ causes error propagation. For this reason, the calculation of $u_{Delta}$ and $t_{Delta}$ must be effected by a division at a high rate of precision, that means a large word size. This also applies to the further processing operation.

One advantage of the second method involves that there is no need for a divider, which is in contrast to the first method. Also, the adder can be rated to a smaller word size.

In contrast to the first and second method described hereinabove where voltages are measured at defined points of time, times are recorded at defined voltage variations in the third method, and it is tested whether these times lie within the tolerance ranges. For this purpose, the minimum and the maximum number of sampling operations are calculated in the setup condition S by means of the measured count c1 of the first counter and the maximum output voltage $u_{max}$ (at $u_{max} <> U_{Ref}$), which number lies just about in the tolerable range between two voltage variations at the output of the A/D converter in consideration of all converter inaccuracies.

In the measuring condition M, the counter is reset after each voltage variation and incremented until the next voltage variation occurs at the output of the A/D converter. It is checked thereafter whether the count of the counter is in a range between the minimum and maximum number of sampling operations which is tolerable for this voltage variation, and whether the differential voltage variation is in the allowable range. No error propagation occurs in this third method due to the resetting of the counter so that an operation with reduced word size is possible.

On the other hand, it must be taken into consideration in this method that the time between two voltage variations is measured as a multiple of the sampling time. According to definition, this corresponds only to a measurement of the differential non-linearity (DNL) in the form of a relative measurement between two sampling values. Absolute deviations from the ideal transmission characteristic curve which are expressed by the integral non-linearity INL are not sensed in this arrangement.

The summation of DHL from '. . . 00' to the ramp stop at '. . . FF' precisely results in the INL. Accordingly, the sum $$t_{sum} = t_{sum} + c2 - t_{Delta}(u_{out} - u_{old})$$

must be formed after each abrupt voltage change at the output of the A/D converter. $t_{sum}$ may only be in the range of $+/- t_{Delta}$ with an INL of $+/-1$ LSB (for example). In this example, c2 is the measured time between the last and the current abrupt change in voltage as an integral number of a sampling operation. Ideally, a change occurs by +1 for all values $t_{Delta}$. However, changes by −1, +2, or +3 bit, etc., may also occur due to noises. This is determined by differentiating ($u_{out} - u_{old}$). In this summation, $t_{Delta}$ must be rated with a higher resolution (than in the second method) because of error propagation.

Figure 7:
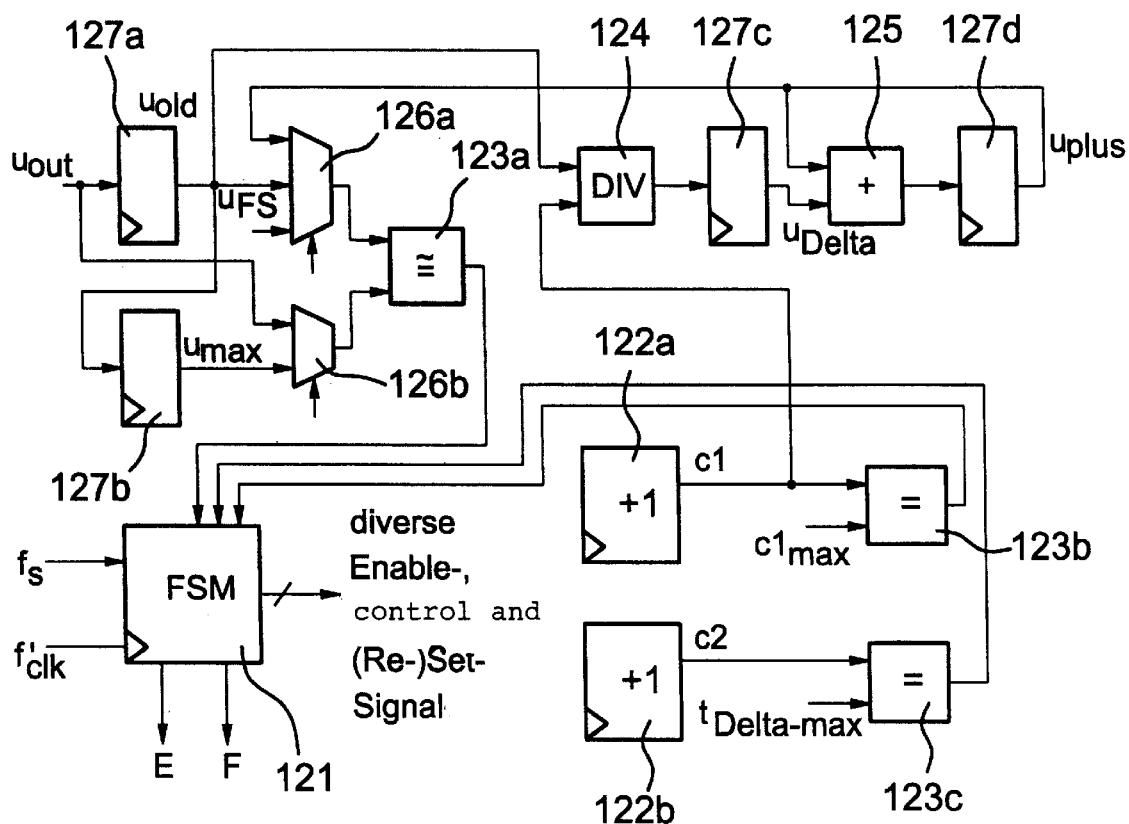
FIG. 7 is a block diagram of a circuit configuration of the present invention.

FIG. 7 shows a possible block diagram of an automatic test machine 12 for implementing the first method. The circuitry is digitized and mainly comprises a control unit 121, a first and a second counter 122a, 122b, a first, second, and a third comparator 123a, 123b, 123c, a divider 124, an adder 125, a first and a second multiplexer 126a, 126b, and a first to fourth register 127a, 127b, 127c, 127d.

The control unit 121 to which the sampling rate $f_s$ and a clock frequency $f_{clk}$ is applied produces the discharge signal E for the capacitor of the ramp signal generator, the error signal F, and various further control signals, resetting signals and release signals. The output voltage $u_{out}$ of the A/D converter is applied to the first register 127a and a first input of the second multiplexer 126b.

The output of the first register 127a as a voltage value $u_{old}$ is connected to a first input of the first multiplexer 126a, the input of the second register 127b, and a first input of the divider 124. The output of the second register 127b is applied to a second input of the second multiplexer 126b. The outputs of the first and second multiplexer 126a, 126b are respectively connected to an input of the first comparator 123a with which the input signals are compared for equality in consideration of the tolerance ranges. The output of the first comparator 123a is connected to the control unit 121.

The output of the first counter 122a as a count c1 is connected to a second input of the divider 124 and a first input of the second comparator 123b. The output of the second counter 122b as a count c2 is connected to a first input of the third comparator 123c. The maximum counted value $c1_{max}$ is applied to a second input of the second comparator 123b, while the value $t_{Delta-max}$ is sent to a second input of the third comparator 123c. The outputs of the second and third comparator are connected to the control unit 121.

The output of the divider 124 is applied to the input of the third register 127c, the output of which as a voltage value $u_{Delta}$ is connected to a first input of the adder 125. The output of the adder 125 is led to the input of the fourth register 127d whose output, as a voltage value $u_{plus}$, is connected to a second input of the adder 125 and a second input of the first multiplexer 126a. Finally, the voltage value $u_{FS}$ is applied to a third input of the first multiplexer 126a.

Because the transmission characteristics of the A/D converter must be measured in all three methods only in relation to the voltage at the ramp stop, they must be supplemented by the measurement of two absolute values, one of which is the offset voltage.

The automatic test machine can be realized also by a computer program in order to reduce the overall complexity of circuits.

What is claimed is:

1. A method for testing an A/D converter, said method including the use of a ramp signal generator for generating a ramp voltage that is delivered to the input of the A/D converter, and a test circuit for activating a test cycle which comprises a first run of the ramp signal generator, by which a reference measurement of the ramp signal generator is carried out for compensating component tolerances, and comprises a second run of the ramp signal generator where an error signal is output when the value that is calculated for a transmission characteristic of the A/D converter lies outside a predetermined tolerance range of the measured value of the transmission characteristic, said method including the steps of:

passing the ramp signal generator through first and second ramp runs, wherein the first run of the ramp includes measuring the period of time that is necessary for a ramp run, wherein this time is used to determine the number of sampling operations needed to reach the maximum ramp voltage wherein the transmission characteristic is the output voltage calculated for one or a plurality of sampling operations, and the error signal is produced when the said output voltage lies outside a predetermined tolerance range of the output voltage measured with these sampling operations.

2. The method as claimed in claim 1, further including the step of compensating for a reference voltage of the A/D converter, a maximum ramp voltage, and a gradient of the ramp voltage with the first run of the ramp signal generator.

3. The method as claimed in claim 1, further including the step of calculating the period of time which is necessary for changing the output voltage by 1 LSB, wherein the transmission characteristic is the output voltage calculated for at least one period of time, and further including producing the error signal when the output voltage lies outside a predetermined tolerance range of the output voltage.

4. The method as claimed in claim 1, wherein the transmission characteristic includes the number of sampling operations which are necessary for a change of the output voltage by one or a plurality of LSBs, and further including the step of producing an error signal when the number of sampling operations lies outside a predetermined tolerance range.

5. A method for testing an A/D converter, said method including the use of a ramp signal generator for generating a ramp voltage that is delivered to the input of the A/D converter, and a test circuit for activating a test cycle which comprises a first run of the ramp signal generator, by which a reference measurement of the ramp signal generator is carried out for compensating component tolerances, and comprises a second run of the ramp signal generator where an error signal is output when the value that is calculated for a transmission characteristic of the A/D converter lies outside a predetermined tolerance range of the measured value of the transmission characteristic, said method including the steps of:

passing the ramp signal generator through first and second ramp runs, wherein the first run of the ramp includes measuring the period of time that is necessary for a ramp run, wherein this time is used to determine the number of sampling operations needed to reach the maximum ramp voltage further including the step of calculating the period of time which is necessary for changing the output voltage by 1 LSB, wherein the transmission characteristic is the output voltage calculated for at least one period of time, and further including producing the error signal when the output voltage lies outside a predetermined tolerance range of the output voltage.

6. A method for testing an A/D converter, said method including the use of a ramp signal generator for generating a ramp voltage that is delivered to the input of the A/D converter, and a test circuit for activating a test cycle which comprises a first run of the ramp signal generator, by which a reference measurement of the ramp signal generator is carried out for compensating component tolerances, and comprises a second run of the ramp signal generator where an error signal is output when the value that is calculated for a transmission characteristic of the A/D converter lies outside a predetermined tolerance range of the measured value of the transmission characteristic, said method including the steps of:

passing the ramp signal generator through first and second ramp runs, wherein the first run of the ramp includes measuring the period of time that is necessary for a ramp run, wherein this time is used to determine the number of sampling operations needed to reach the maximum ramp voltage wherein the transmission characteristic includes the number of sampling operations which are necessary for a change of the output voltage by one or a plurality of LSBs, and further including the step of producing an error signal when the number of sampling operations lies outside a predetermined tolerance range.

* * * * *